United States Patent [19]

Mahawili

[11] Patent Number: 5,059,770
[45] Date of Patent: Oct. 22, 1991

[54] MULTI-ZONE PLANAR HEATER ASSEMBLY AND METHOD OF OPERATION

[75] Inventor: Imad Mahawili, Sunnyvale, Calif.
[73] Assignee: Watkins-Johnson Company, Palo Alto, Calif.
[21] Appl. No.: 409,125
[22] Filed: Sep. 19, 1989
[51] Int. Cl.⁵ .............................................. F27B 5/14
[52] U.S. Cl. ................................. 219/391; 219/390; 219/464
[58] Field of Search ............... 219/391, 395, 390, 405, 219/411, 464, 465, 466, 468

[56] References Cited

U.S. PATENT DOCUMENTS

| | | | |
|---|---|---|---|
| 1,706,015 | 3/1929 | Wiegand | 219/465 |
| 3,536,892 | 10/1970 | Walther | 219/439 |
| 3,836,751 | 9/1974 | Anderson | 219/411 |
| 3,842,794 | 10/1974 | Ing | 219/390 |
| 4,002,883 | 1/1977 | Hurko | 219/464 |
| 4,101,759 | 7/1978 | Anthony | 219/405 |
| 4,292,276 | 9/1981 | Enomoto | 219/390 |
| 4,503,807 | 3/1985 | Nakayama | 219/405 |
| 4,545,327 | 10/1985 | Campbell | 219/405 |
| 4,859,832 | 8/1989 | Uehara | 219/411 |

Primary Examiner—Teresa J. Walberg
Attorney, Agent, or Firm—John A. Bucher

[57] ABSTRACT

A heater assembly and method of operation for use in processing of a substrate such as a semiconductor wafer, for example in a chemical vapor deposition (CVD) reactor chamber, the heater assembly including a dielectric heater base, radially spaced apart and circumferentially extending heater element segments being arranged on the heater base, operation of the plurality of heater elements being independently regulated, a heater shroud being arranged in spaced apart relation over the heater elements while supporting the substrate for maintaining a blanket of inert gas between the heater elements and the heater shroud. Inert gas is preferably introduced through a central opening in the heater base and is selectively regulated for facilitating processing of the substrate.

25 Claims, 2 Drawing Sheets

MULTI-ZONE PLANAR HEATER ASSEMBLY AND METHOD OF OPERATION

FIELD OF THE INVENTION

The present invention relates to a heater assembly and method of its operation for use in processing a substrate such as a semiconductor wafer and more particularly to such a heater assembly and method of operation for use in a chemical vapor deposition (CVD) reactor.

BACKGROUND OF THE INVENTION

In semiconductor wafer processing, for example, CVD, and similar methods, substrates such as silicon wafers are typically heated to various temperatures in order to carry out different thin film deposition or etch operations. Various techniques have been employed in the prior art for heating these thin substrates, including: (1) infrared heating; (2) visible light source heating; (3) radio frequency coupled heaters; and (4) hot plate heaters.

In the first type of heater, the substrate was physically rotated past an array of infrared lamps in an effort to achieve required uniform temperatures throughout the silicon wafer. However, the physical rotation step tended to interfere with distribution of gas flow over and onto the wafer, thus resulting in processing limitations.

In the second heating method, temperature uniformity was attempted by employing very complex and expensive optical reflectors. Stability and uniformity of temperatures were determined by complex radiative interaction of the various surfaces according to their respective emissivities.

The third method, while also complex and expensive, has been commonly employed particularly for processing temperatures in the range of 1,000-1,200 degrees centigrade (°C.). However, this method has offered sub-optimal temperature uniformity on the substrate while being very difficult to manipulate in order to achieve even a moderate level of temperature uniformity.

The fourth method has typically been employed for low temperature applications, for example below 500° C. Such hot plate heaters have commonly consisted of an embedded resistance wire in a ceramic or dielectric plate or a high thermally conductive metal such as aluminum. While satisfactory temperature uniformity has been achieved by this method, it has not been found suitable for use in high temperature processing due, for example, to limits established by metal melting points, bonding materials employed and the emission of contaminants from the heating element and the metals particularly at such higher temperatures.

SUMMARY OF THE INVENTION

Accordingly, there has been found to remain a need for an improved heater assembly and method of operation for use in such techniques. Generally, semiconductor wafer processing techniques such as those described above require temperature uniformity across the entire wafer area, typically with a variation of no more than ±2° C. in order to achieve uniform film processing (deposition or etch, for example) on the wafer or substrate. Such temperature uniformity is required in processes which may be carried out in a temperature range of typically 250°-1,250° C.

Semiconductor processing techniques are further complicated by the requirement for heating of the wafers or substrates from one side only in order to allow a gas delivery system (on the other side of the substrate) to be at a different temperature for optimal chemical processing. A fundamental problem arises in such heating techniques in that heat losses in central portions of the substrate tend to be very different from heat losses in edge portions. Thus, if a substrate is uniformly heated across its area, heat loss characteristics of the substrate normally cause it to assume a temperature profile which, when viewed in diametric cross-section, will be relatively low at the diametric edges and relatively high midway between those diametric extremities. Furthermore, relative heat losses and the temperature profile referred to above vary at different temperature levels and at different pressures. Thus, as processing temperatures are increased for a substrate, there will be a corresponding increase in the temperature profile, that is, a greater contrast between maximum and minimum temperatures in different areas of the substrate. In addition, the temperature profile is also affected by processing pressure. This is due in part to the fact that, at pressures below about 5 Torr, the heat transfer mechanism is mostly by radiation whereas, above about 10 Torr, the heat transfer mechanism involves a combination of radiation and convection.

In any event, the preceding discussion is set forth in order to further emphasize the difficulties in maintaining uniform surface temperatures throughout a substrate, particularly where the substrate is being processed at a variety of temperatures and/or pressures.

It is therefore an object of the invention to provide an improved heater assembly and method of operation for the heater assembly in the processing of substrates or wafers in order to overcome one or more problems as discussed above.

More specifically, it is an object of the invention to provide a heater assembly for use in the processing of substrates or wafers in order to develop and maintain a uniform elevated temperature throughout the substrate, the heater assembly including a dielectric heater base having a generally circular surface, a plurality of heater elements forming radially spaced and circumferentially extending segments which substantially cover the circular surface of the heater base, a heater shroud arranged in spaced apart relation from the heater element segments and intermediate the heater elements and the substrate, separate means for operating the plurality of heater elements and means for maintaining a blanket of inert gas adjacent the heater element segments.

Such a combination provides a multi-zone planar heater assembly and method of operation therefor permitting modification in heating patterns for the substrate in order to eliminate or minimize temperature profile effects as discussed above. In particular, the heater assembly may be provided with any number of heater element segments which are preferably radially separated and circumferentially extending in configuration. With such a heater configuration, the different heater element segments can be adjusted to achieve different heating temperatures in order to either compensate for or substantially eliminate temperature variations throughout the substrate.

The heater element segments are preferably formed from electrically conductive material or metal capable of resistance heating. The dielectric heater base is then preferably formed from a dielectric material having a similar coefficient of thermal expansion as the heater element segments while also being selected to resist separation from the heater elements and to remain dimensionally stable during rapid and extensive temperature variations. A particularly preferred combination of materials is a heater base formed from boron nitride with the heater element segments being formed from pyrolytic graphite.

In a preferred method of construction, the conductive material for the heater elements is uniformly deposited upon the heater base, circumferential regions of the conductive material then being removed, for example by machining, to define the radially spaced apart heater element segments. Each heater element segment is also preferably interrupted by a radially extending line or region so that electric contact can be made on opposite end portions of each heater segment for causing resistance heating.

It is yet a further object of the invention to provide a heater assembly and method of operation including means for maintaining an inert gas blanket over the heater element, for example, to prevent oxidation, etc. Preferably, a central opening in the heater base forms an inlet for the inert gas so that it flows radially outwardly over the heater elements. The inert gas can then be exhausted about the periphery of the heater shroud.

Preferably, the heater assembly is adapted for use in reactor chambers, more particularly in a CVD reactor chamber. For example, the heater assembly of the present invention is contemplated for use in a CVD deposition method as disclosed in a copending U.S. patent application Ser. No. 07/370,331 filed June 22, 1989 by the present inventor and entitled METHOD OF DEPOSITING SILICON DIOXIDE FILM AND PRODUCT. In addition, the heater assembly of the present invention is also contemplated for use within a CVD reactor chamber of the type disclosed in another copending U.S. patent application Ser. No. 07/386,903 filed July 28, 1989 by the present inventor and entitled CHEMICAL VAPOR DEPOSITION REACTOR AND METHOD OF OPERATION. Those two copending applications are accordingly incorporated herein by reference as though set forth in their entirety in order to assure a more complete understanding of the present invention.

It is a further related object of the invention to provide a method of operation for a heater assembly as summarized above. In both the heater assembly design and method of operation, it is contemplated that the means for regulating operation of the multiple heating elements and also the means for regulating flow of inert gas can be varied in order to facilitate processing of the wafer. In particular, by adjusting the heating effect of the different heater elements, temperature variations occurring diametrically across a substrate can readily be substantially eliminated or reduced to a satisfactory level, even for a wide variety of operating temperatures and/or pressures. Furthermore, heating capacities of the respective heating elements are selected in order to permit rapid heating of the substrate to greatly elevated temperatures in a very short period of time. For example, it is contemplated that the heater assembly of the present invention may be employed to heat a substrate or semiconductor wafer from ambient to a desired processing temperature, typically 1,000°-1,100° C., over a time interval of about one minute.

At the same time, the ability to adjust the flow rate and/or the type of inert gas even further enhances versatility of the heater assembly. For example, in addition to preventing oxidation, increased inert gas flow may be provided, for example, between processing operations in order to more rapidly cool down both the heater assembly and the substrate to facilitate interchange of substrates where sequential operations are contemplated.

Additional objects and advantages of the invention are made apparent in the following description having reference to the accompany drawings.

DESCRIPTION OF THE PREFERRED EMBODIMENT

Figure 1:
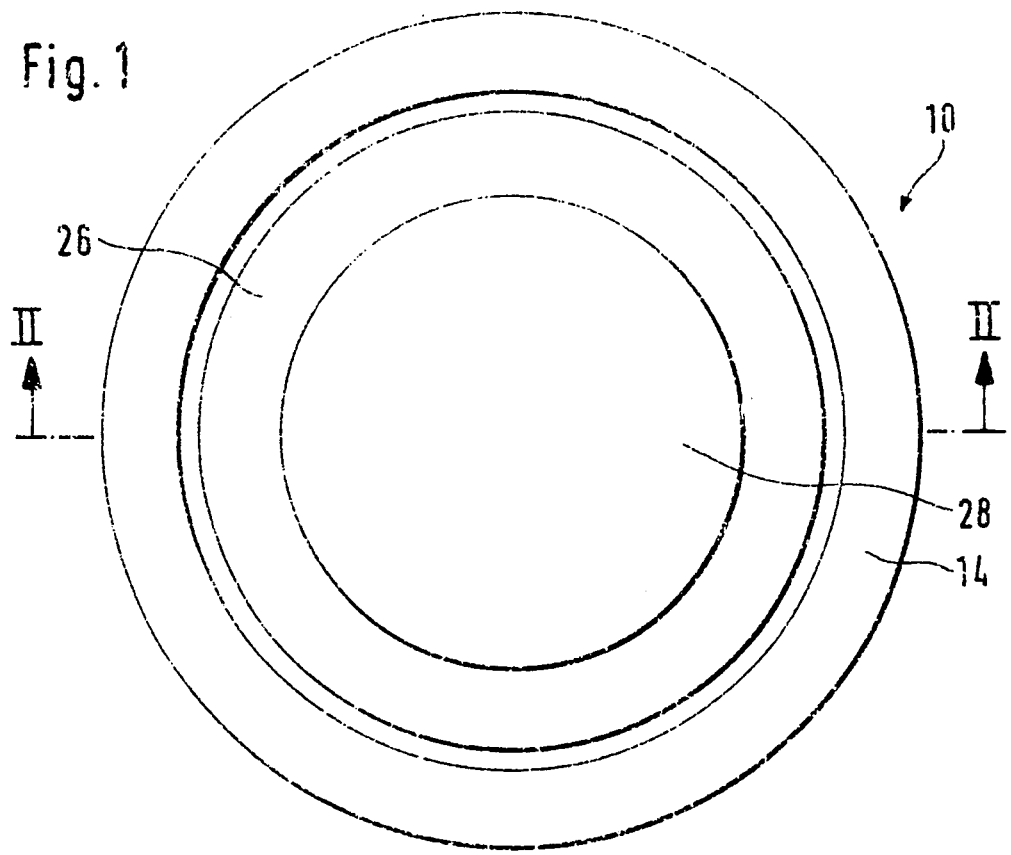
FIG. 1 is a plan view of the heater assembly with a substrate or silicon wafer in the form of a cylindrical disk being mounted thereupon.
Figure 2:
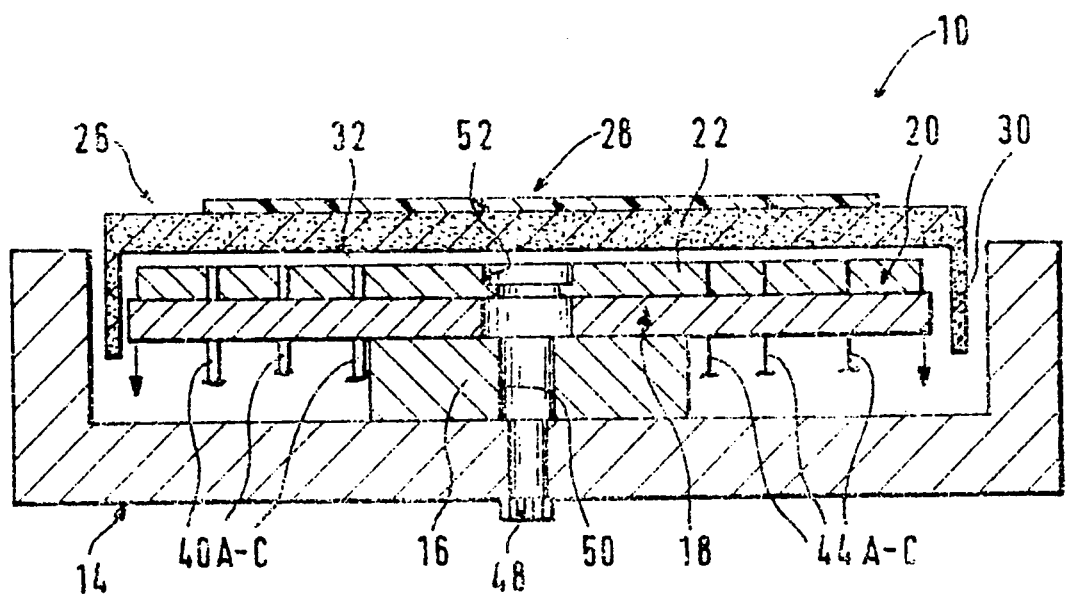
FIG. 2 is a side view, with parts in section, taken along section line II—II of FIG. 1 in order better illustrate internal construction of the heater assembly.
Figure 3:
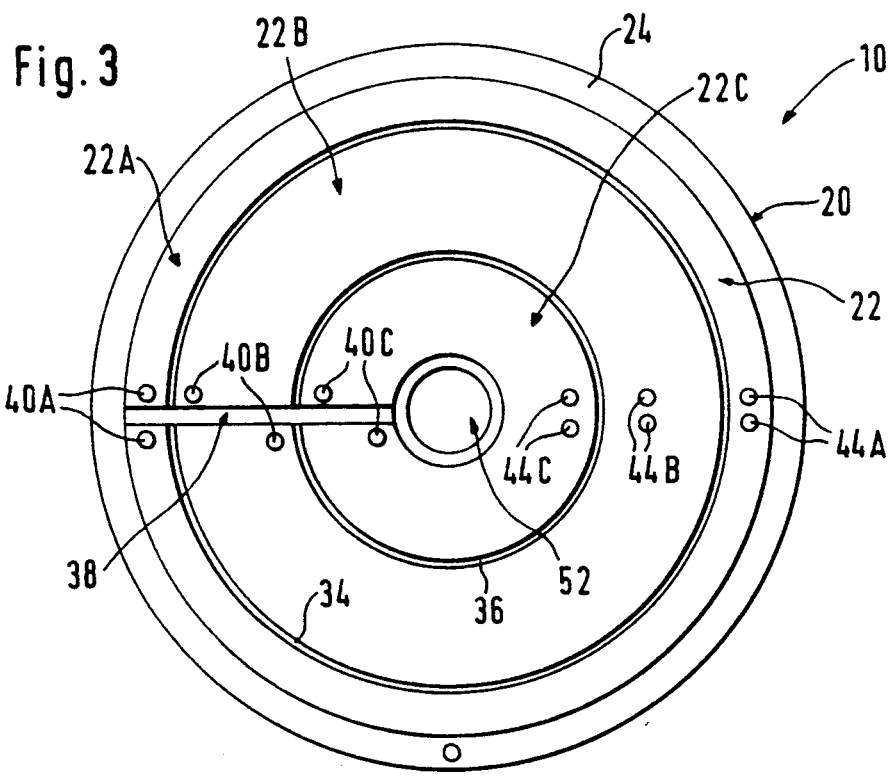
FIG. 3 is a plan view of the heater assembly, similar to FIG. 1 but with the substrate and heater shroud removed to better illustrate a plurality of heating element segments.

Referring now to the drawings and particularly FIGS. 1-3, a heater assembly constructed according to the present invention is generally indicated at 10. The heater assembly 10 is preferably adapted for use within a reactor such as that schematically indicated at 12 in FIG. 4. The CVD reactor 12 may, for example, be of a type contemplated and described in greater detail within either of the copending references noted above. Accordingly, no further description of the CVD reactor or its general mode of operation is believed necessary within the scope of the present invention.

Figure 4:
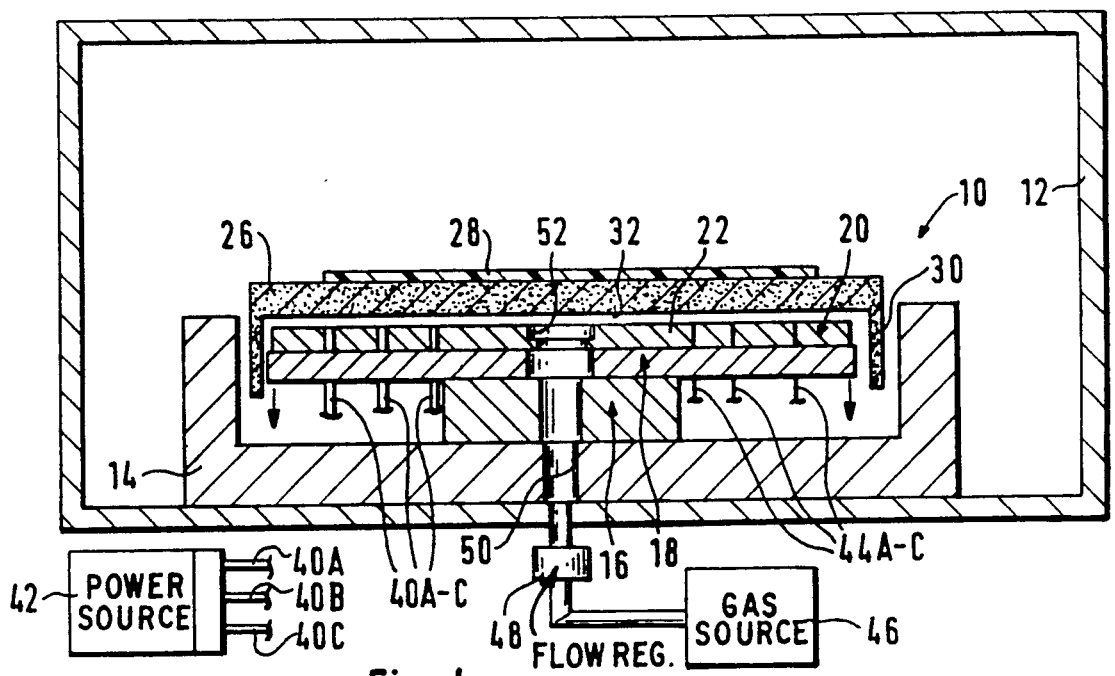
FIG. 4 is a schematic representation of the heater assembly, generally in side view, arranged within a CVD reactor.

Referring particularly to FIG. 2, the heater assembly 10 includes a water cooled, heater support monolith 14 capable of being mounted within a reactor chamber as illustrated in FIG. 4.

A tubular riser 16 is centrally secured to the monolith with a heater support point 18 being mounted thereupon. Both the tubular riser 16 and heater support point 18 are preferably formed from nickel plated stainless steel in order to withstand contemplated high temperatures and to avoid introducing contaminants thereinto.

A disk-shaped heater base 20 formed from a suitable dielectric material as described in greater detail below is mounted upon the support plate 18 with a plurality of heater elements, collectively indicated at 22, being arranged on a generally circular surface 24 of the heater base. Construction of the heater base 20 and heater elements 22 is described in greater detail below.

As for the overall construction of the heater assembly, a cover or shroud 26 is also supported by the monolith 14 in spaced apart relation from the heater elements 22. Preferably, the shroud 26 is formed from a material such as quartz and includes means for supporting a substrate or silicon wafer 26 on its upper surface directly above the heater elements 22.

The shroud 26 includes a flange or skirt extending downwardly in spaced apart relation about both the heater base 20 and support plate 18. The skirt 30 is also spaced apart from a cylindrical flange portion 30 of the monolith 14. Thus, the shroud 26 serves both to support the substrate 28 above the heater elements and also to enclose a space above the heater elements to assure formation of an inert gas blanket over the heater elements as described in greater detail below.

Referring particularly to FIG. 3 in combination with FIG. 2, the heater elements 22 include a plurality of heater element segments indicated respectively at 22A, 22B and 22C which are slightly spaced apart radially from each other while being circumferentially extending to cover substantially the entire surface 24 of the heater base 20. Although the heater assembly of the present invention is thus described with three specific heater element segments, it will be apparent that any number of such segments could be employed as necessary for assuring uniform temperature control over the substrate 28.

The heater element segments 22A-C are preferably formed from an electrically conductive material, more preferably a metal, deposited directly upon the heater base 20. The deposited material is then removed, for example, by means of machining in order to form circumferential regions or gaps 34 and 36 providing radial spacing between the respective heater element segments 22A-C.

A radially extending region or gap 38 is also formed to intersect all three heater element segments. With the heater element segments thus being formed upon the heater base, electrode pairs 40A-C extend upwardly through the support plate 18 and heater base 20 as illustrated in FIG. 2 for respective connection with the heater element segments 22A-C on opposite sides of the radial gap 38. The electrode pairs are coupled with a suitable power source 42, see FIG. 4, the power source being capable of individually regulating power supply to the respective heater element segments in order to closely and accurately adjust heating temperatures developed by the respective segments.

Central portions of the heater element segments 22A-C opposite the electrode pairs 40A-C, are interconnected with thermocouple pairs 44A-C respectively. The thermocouple pairs 44A-C form part of a standard proportional/integral/differentially (PID) electronic temperature controller (forming part of the power source 42 and not otherwise illustrated) in order to provide individual control for the respective heater element segments.

In any event, with the capability of sensing the output energy or temperature of each heater element segment or zone 22A-C, a temperature profile across a diametrical section of the heater can be electronically manipulated, in a manner well known to those skilled in the art, in order to achieve close regulation and minimum variation over the temperature profile. In any event, such controls permit the maintenance of a desired temperature profile under widely varying conditions of pressure and temperature in order to maintain a uniform temperature field within ±2° C. across the substrate 28.

As noted above, an inert gas blanket is preferably maintained over the heater element segments 22A-C in order to prevent oxidation of the segments and also to facilitate and enhance operation of the heater assembly. In that regard, an inert gas such as nitrogen, helium, argon, etc. is supplied from a source 46 (see FIG. 4) through a flow regulating device 48 into a passage 50 extending axially upwardly through the monolith 14, riser 16 and heater support plate 18 to an opening 52 formed centrally in the heater base 20. With the opening 52 being formed in the heater base 20, the surface 24 covered by the heater element segments 22A-C is actually an annulus as best illustrated in FIG. 3.

In any event, when inert gas is introduced through the opening 52 in the heater base 20, it enters the space 32 between the heater element segments and the shroud 26, the inert gas flowing radially outwardly to blanket all of the heater element segments. As the inert gas flows radially outwardly past the heater element segments and heater base, it then flows around an exhaust passage formed by the skirt 30 and escapes into the reactor chamber 12 to be exhausted along with other gases from the reactor in a conventional manner.

Within the heater assembly 10 as described above, the heater element segments 22A-C are preferably formed from pyrolytic graphite which is particularly suited for withstanding high temperatures contemplated by the invention. At the same time, it is important that the dielectric material forming the heater base 20 be formed from a material having a similar coefficient of thermal expansion as the heater element segments in order to prevent separation therebetween, the dielectric material of the heater base 20 further being selected to remain dimensionally stable and to prevent emission of contaminants during rapid and extensive temperature variations. Most preferably, the heater base 20 is formed from boron nitride which satisfies the requirements summarized above. In addition, the boron nitride material has a white color tending to reflect heat upwardly toward the substrate (see FIGS. 2-4). In addition, the pyrolytic graphite can be deposited with good adhesion onto the boron nitride and readily machined away in order to form the circumferential and radial gaps 34-38 as described above.

The pyrolytic graphite is preferably deposited to a thickness of about 0.040 inches in order to provide desired or required film resistance. The heater base 20 may be formed with a typical diameter of about 10 inches and a thickness of about 0.25 inches.

As noted above, a wide variety of power capabilities is provided by the power source 42 for the respective heater element segments 22A-C. In one example, the outer heater element segment 22A may be designed with a power delivery capability of up to about 4,000 watts, the intermediate heater element segment 22B with a power delivery capability of up to about 3,500 watts and the inner heater element segment 22C with a power delivery capability of up to about 2,500 watts.

With such a configuration and with materials as preferably noted above, the heater assembly is capable of operation under a wide variety of operating parameters contemplated in various processing techniques.

The method of operation for the heater assembly is believed apparent from the preceding description. However, the method of operation is described briefly below in order to assure a complete understanding of the invention.

Initially, the heater assembly is constructed and arranged as described above, preferably within a reactor chamber such as that illustrated in FIG. 4.

A substrate such as the silicon wafer indicated at 28 is then mounted upon the heater shroud 26. Operation of the heater assembly 10 is initiated by actuating the power source 42 under a desired set of operating parameters according to the particular application and by initiating the flow of inert gas from the source 46.

With appropriate power levels being supplied to the heater element segments 22A-C, they are rapidly heated to respective temperatures assuring a generally uniform temperature profile across any selected diametric section of the substrate 28.

The material of the heater element segments 22A-C is protected from oxidation under the severe temperatures developed by inert gas flow as described above.

With the substrate uniformly heated as described above, a deposition or etch process may then be carried out within the reactor chamber 12 in a manner contemplated and well known to those skilled in the art.

The heater assembly of the present invention further facilitates such operations in that where successive deposition or etching processes are contemplated, power from the power source 42 may be interrupted and flow of inert gas from the source 46 increased in order to rapidly cool various portions of the heater assembly 10 and the substrate 28. Thus, rapid interchange of substrates is made possible with greater efficiency for both the heater assembly and reactor chamber 12. Even greater cooling may be achieved, for example, by supplying a different inert gas capable of high thermal conductivity than an inert gas employed during the particular process. When the heater assembly is cooled and the substrate 28 cooled and replaced, the operating steps described above may then be repeated for similarly processing the subsequent substrate.

The heater assembly 10 is contemplated for developing temperatures over a wide range as noted above. For example, typical temperatures developed in the substrate may range from approximately 200° C. to about 1,200° C. and the heater assembly 10 is particularly effective for assuring uniform temperatures over that entire temperature range.

Thus, there has been described an effective heater assembly and method of operation for developing and maintaining uniform elevated temperatures in a substrate. Numerous variations and modifications in addition to those specifically described above will be apparent from the preceding description. Accordingly, the scope of the present invention is defined only by the following appended claims which provide further examples of the invention.

What is claimed is:

1. A heater assembly for use in semiconductor wafer processing for developing and maintaining a uniform elevated temperature in the wafer, comprising
   a dielectric heater base having a circular surface,
   a plurality of heater elements arranged on the circular surface of the heater base and formed from conductive material capable of resistive heating, the plurality of heater elements forming radially spaced, circumferentially extending segments which, in combination, substantially cover the circular surface, the heater element segments being separated from each other by circumferentially extending regions, each heater element segment being interrupted by a radially extending region,
   separate means for respectively regulating operation of the plurality of heater elements, the separate means for respectively regulating operation of the plurality of heater elements comprising electrical couplings operatively coupled with each heater element segment opposite the respective radially extending region,
   a heater shroud arranged in spaced apart relation from the plurality of heater elements and intermediate the heater elements and the semiconductor wafer, and
   means for maintaining a blanket of inert gas between the heater elements and the heater shroud.

2. The heater assembly of claim 1 wherein the heater elements are formed from pyrolytic graphite.

3. The heater assembly of claim 1 wherein the heater elements are formed by uniformly depositing the conductive material over the circular surface of the dielectric heater base and then selectively removing portions of the conductive material to form the heater elements.

4. The heater assembly of claim 3 wherein the heater element segments are separated from each other by circumferentially extending regions, each heater element segment being interrupted by a radially extending region, the separate means for respectively regulating operation of the plurality of heater elements comprising electrical couplings formed on portions of each heater element segment opposite the respective radially extending region.

5. The heater assembly of claim 1 wherein the heater base is formed from dielectric material selected to have a similar coefficient of thermal expansion as the conductive metal in the heater elements, the dielectric material also being selected to resist separation from the conductive metal and to remain dimensionally stable during rapid an extensive temperature variations.

6. The heater assembly of claim 5 wherein the heater base is formed from boron nitride and the heater element segments are formed pyrolytic graphite.

7. The heater assembly of claim 1 wherein the heater shroud includes means for supporting the wafer thereupon.

8. The heater assembly of claim 1 wherein the means for maintaining an inert gas blanket comprises a central opening in the heater base forming an inert gas inlet so that inert gas from the central inlet flows radially outwardly between the heater element segments and the heater shroud.

9. The heater assembly of claim 8 further comprising means formed about a peripheral portion of the heater shroud for venting the inert gas.

10. The heater assembly of claim 8 further comprising means for regulating inert gas flow through the central opening for facilitating processing of the semiconductor wafer.

11. The heater assembly of claim 1 wherein the means for maintaining an inert gas blanket comprises a central opening in the heater base forming an inert gas inlet so that inert gas from the central inlet flows radially outwardly between the heater element segments and the heater shroud.

12. The heater assembly of claim 11 further comprising means formed about a peripheral portion of the heater shroud for venting the inert gas.

13. The heater assembly of claim 11 further comprising means for regulating inert gas flow through the central opening for facilitating processing of the semiconductor wafer.

14. The heater assembly of claim 1 wherein the heater assembly and wafer are arranged in a chemical vapor deposition (CVD) reactor chamber.

15. A method of heating a substrate during semiconductor wafer processing and for developing and maintaining a uniform elevated temperature in the substrate, comprising the steps of
   forming a heater assembly to include a dielectric heater base having a circular surface, a plurality of heater elements arranged on the circular surface of the heater base, the plurality of heater elements forming radially spaced, circumferentially extending segments which, in combination, substantially cover the circular surface, and a heater shroud arranged in spaced apart relation from the plurality of heater elements and intermediate the heater elements and the substrate, maintaining a blanket of inert gas between the heater elements and the heater shroud during operation of the heater assembly, and separately regulating operation of the plurality of heater elements in order to achieve different heating temperatures in the respective heater elements and thereby substantially eliminate temperature variations throughout the substrate for facilitating and enhancing processing of the substrate.

16. The method of claim 15 wherein the heater elements are formed from a conductive material selected for resistive heating.

17. The method of claim 16 wherein the heater elements are formed from pyrolytic graphite.

18. The method of claim 16 wherein the heater elements are formed by uniformly depositing the conductive material on the circular surface of the heater base and then selectively removing portions of the metal to form the heater elements.

19. The method of claim 15 further comprising the step of supporting the substrate in thermally conductive relation upon the heater shroud.

20. The method of claim 15 wherein the inert gas blanket is maintained by introducing inert gas through a central opening in the heater base and allowing the inert gas to flow radially outwardly over the heater elements.

21. The method of claim 20 further comprising the step of venting the radially flowing inert gas about a peripheral portion of the heater shroud.

22. The method of claim 21 further comprising the step of regulating inert gas flow through the central opening of the heater base for facilitating processing of the substrate.

23. The method of claim 22 further comprising the step of mounting the heater assembly and substrate within a chemical vapor deposition (CVD) reactor chamber and thereafter operating the heater assembly as part of a CVD process for treating the substrate.

24. The method of claim 15 further comprising the step of regulating inert gas flow through a central opening of the heater base for facilitating processing of the substrate.

25. The method of claim 24 further comprising the step of mounting the heater assembly and substrate within a chemical vapor deposition (CVD) reactor chamber and thereafter operating the heater assembly as part of a CVD process for treating the substrate.

* * * * *